United States Patent
Hyland

(10) Patent No.: US 10,393,095 B2
(45) Date of Patent: Aug. 27, 2019

(54) PROPULSIVE DEVICES THAT COMPRISE SELECTIVELY REFLECTIVE EPITAXIAL SURFACES

(71) Applicant: EXCALIBUR ALMAZ USA, Houston, TX (US)

(72) Inventor: David Hyland, College Station, TX (US)

(73) Assignee: EXCALIBUR ALMAZ USA INC, Houston, TX (US)

( * ) Notice: Subject to any disclaimer, the term of this patent is extended or adjusted under 35 U.S.C. 154(b) by 0 days.

(21) Appl. No.: 15/555,548

(22) PCT Filed: Mar. 2, 2016

(86) PCT No.: PCT/US2016/020529
§ 371 (c)(1),
(2) Date: Sep. 4, 2017

(87) PCT Pub. No.: WO2016/164122
PCT Pub. Date: Oct. 13, 2016

(65) Prior Publication Data
US 2018/0051680 A1    Feb. 22, 2018

Related U.S. Application Data

(60) Provisional application No. 62/127,048, filed on Mar. 2, 2015.

(51) Int. Cl.
*F03H 3/00* (2006.01)
*H02K 99/00* (2014.01)
*H01L 49/02* (2006.01)
*G02F 1/19* (2019.01)

(52) U.S. Cl.
CPC ............... *F03H 3/00* (2013.01); *H01L 49/02* (2013.01); *H02K 99/20* (2016.11); *G02F 1/19* (2013.01); *G02F 2202/34* (2013.01)

(58) Field of Classification Search
CPC ........... F03H 3/00; F03H 99/00; H02K 99/20; H01L 49/02; B64G 1/24; B64G 1/409; B64G 1/286; B64G 1/40
USPC .......................................... 60/527–529, 671
See application file for complete search history.

(56) References Cited

U.S. PATENT DOCUMENTS

2003/0047677 A1* 3/2003 Pinto ........................ F03G 7/00
250/251
2006/0165148 A1* 7/2006 Song ........................ H01S 5/183
372/99
2010/0237198 A1    9/2010 Cormier

OTHER PUBLICATIONS

Yelin, Susanne. The Dynamic Casimir Effect. Jul. 18, 2014. https://www.youtube.com/watch?v=r2txJBvjw5l.*
Dynamical Casimir effect within reach of optomechanics. May 11, 2018. http://www.riken.jp/en/research/rikenresearch/highlights/20180511_FY20180005/.*

(Continued)

*Primary Examiner* — Mark A Laurenzi
*Assistant Examiner* — Mickey H France
(74) *Attorney, Agent, or Firm* — Law Office of Arthur M. Dula; Art Dula; Scott Maddox

(57) ABSTRACT

A device for generating thrust using the dynamic Casimir effect comprising: an epitaxial stack of closely spaced parallel semiconductor laminae; and a voltage source; wherein each said semiconductor lamina is connected to said voltage source such that said voltage source can apply voltage to each semiconductor lamina.

12 Claims, 3 Drawing Sheets

(56) References Cited

OTHER PUBLICATIONS

First observation of the dynamical Casimir effect. MIT Technology Review. May 26, 2011. https://www.technologyreview.com/s/424111/first-observation-of-the-dynamical-casimir-effect/.*

Jones, Andrew Zimmerman. What is the Casimir effect? ThoughtCo. Mar. 6, 2017. https://www.thoughtco.com/what-is-the-casimir-effect-2699353.*

What is the Casimir effect? Scientific American. 2018. https://www.scientificamerican.com/article/what-is-the-casimir-effec/.*

G. Jordan Maclay, " Thrusting Against the Quantum Vacuum" in Frontier of Propulsion Science, AAIA CH12 (2009) [online] [ retrieved on Sep. 7, 2016]. Retriever from the Internet ,URL: http://www.quantumfields.com/13_Maclay_Final1.pdf> p. 1. 15.

Messineo et al., "MIR: an experiment for the detection of the Dynamical Casimir Effect" (Jul. 31, 2009) [online] [retrieved on Sep. 7, 2016]. Retrieved from the internet, URL: https://www.ts.infn.it/fileadmin/gen/eventi/Seminari_di_Sezione/Seminari_di_Sezione2009/Messineo.pdf. p. 4,7.

G. J. Maclay, "The Role of Quantum Vacuum in Space Travel" JBIS. vol. 68 (Jan. 2015) Online [Retrieved on Sep. 7, 2016]. Retrieved from the internet<URL: https://www.researchgate.net/publication268278550_The_Role_of_the_Quantum_Vacuum_in_Space_Travel> entire document.

"The 2015 AAS/AIAA Astrodynamics Specialist Conference" Conference Program. Vail, Colorado (Jul. 31, 2015) [online] [retrieved on Sep. 7, 2016]. Retrieved from the internet <URL: http://www.space-flight.org/docs/2015_astro/ASC2015_Conference_Program.pdf> p. 70.

* cited by examiner

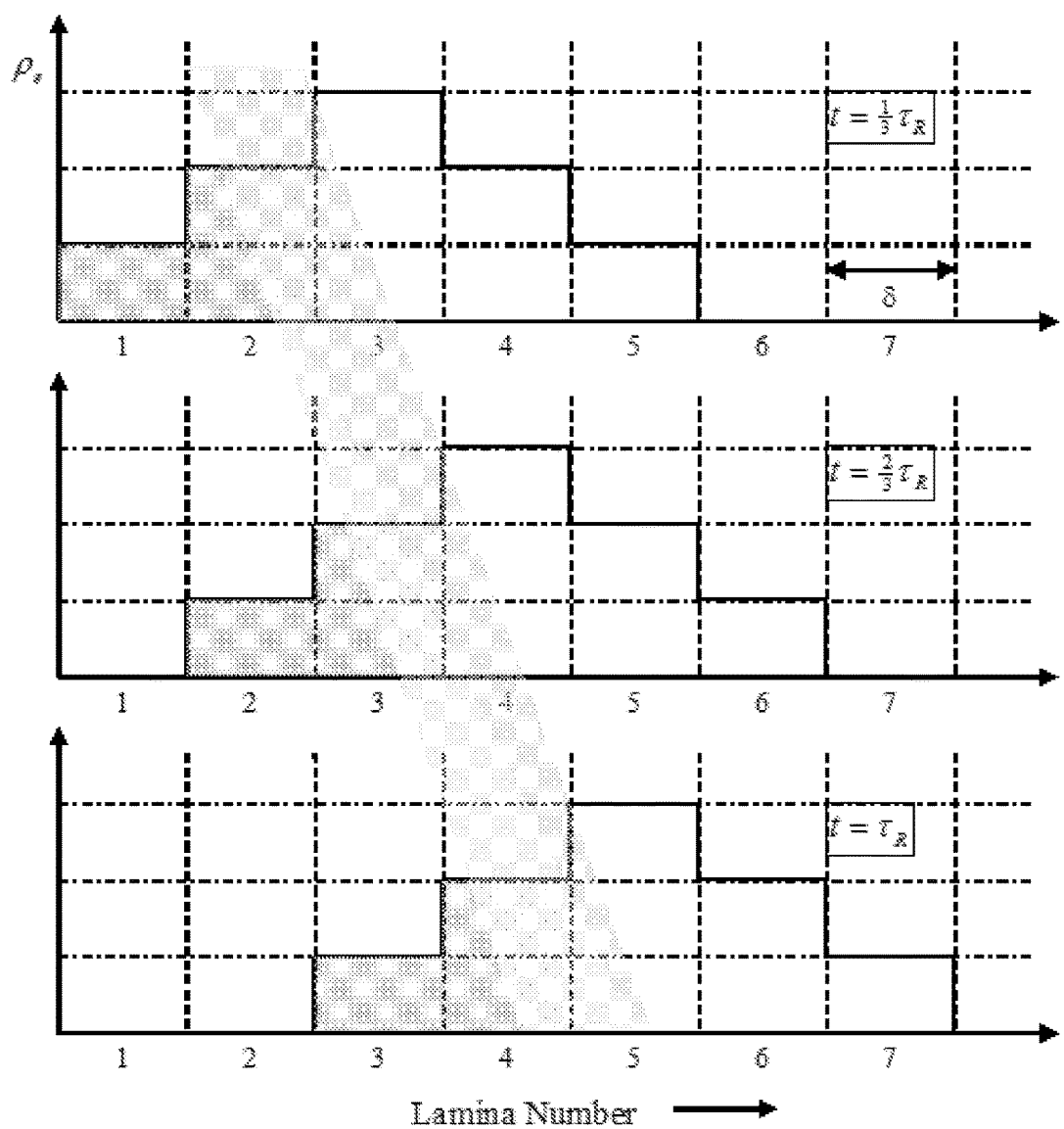

US 10,393,095 B2

PROPULSIVE DEVICES THAT COMPRISE SELECTIVELY REFLECTIVE EPITAXIAL SURFACES

This application is the 371 of international application PCT/US16/20529 which claims the benefit of U.S. provisional patent application No. 62/127,048

FIELD

The present invention is related generally to propulsive devices that use the dynamic Casimir effect. More particularly, the present invention is related to Casimir effect propulsive devices that comprise selectively reflective epitaxial surfaces.

BACKGROUND

The dynamic Casimir effect is a possible mechanism for propulsion. Previous investigations assumed mechanical motion of a mirror to generate thrust. Because of the finite strength of materials and the high frequencies necessary, the amplitudes of motion must be restricted to the nanometer range.

More than 60 years ago, H. B. G. Casimir and Casimir and D. Polder explained the retarded van der Waals force in terms of the zero-point energy of a quantized field. Both the static and dynamic Casimir effects are discussed in several large reviews. The dynamic Casimir effect has involved the interaction between moving mirrors and the ground state ("vacuum state") of the electromagnetic field.

When estimating the magnitude of the force that could be generated, Maclay and Forward assumed that the amplitude of high frequency motion of an actual mirror need be in the nanometer range due to the finite strength of materials. This restriction limits the possible propulsive force to very small values.

In a thorough treatment of the pressure on moving mirrors due to the Casimir effect, Neto and his colleagues took a perturbative approach consistent with the assumption that the mirror motion be constrained to very small amplitudes.

BRIEF DESCRIPTION OF THE DRAWINGS

FIG. 5 shows temporal progression of carrier density as laminae are successively pulsed.

DESCRIPTION

Figure 1:
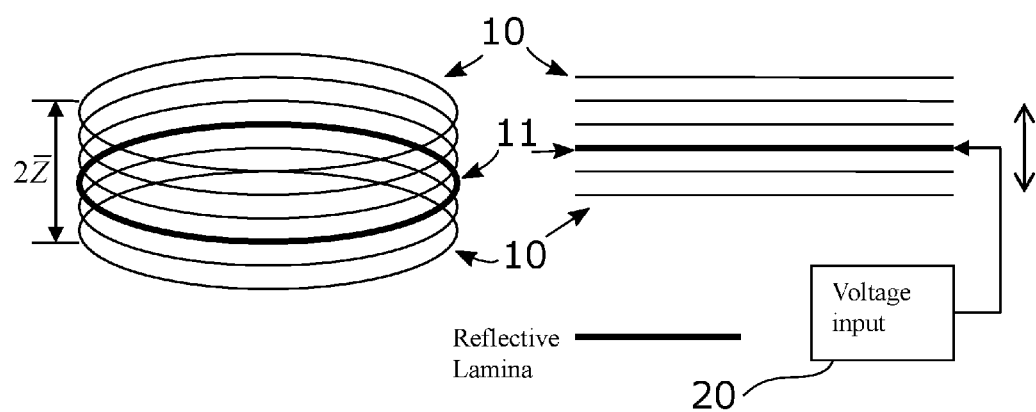
FIG. 1 shows an embodiment comprising an epitaxial assembly of semiconductor laminae.

A new feature of an embodiment of the present invention is that mechanical motion of a single reflective surface is not essential: that the Casimir effect is due to the motion of the boundary conditions constraining the free field in its ground state. To understand the efficacy of an embodiment of the present invention one must extend the analysis to large motions made possible using an epitaxial approach; obtain explicit expressions for the forces produced by a particular trajectory of motion; and estimate the numerical values of these forces Amorphous oxide transparent semiconductors used for thin film applications make possible large motions of reflective surfaces without mechanically moving parts. An epitaxial assembly of semiconductor laminae is illustrated in FIG. 1. Without the application of voltage, each lamina 10 is a partially transparent dielectric; but when supplied by voltage the lamina becomes a reflecting conductor 11 serving as a mirror. Voltage source 20 provides voltage inputs that can be switched among the laminae 10 at high speed, effectively moving the mirror 11 at high velocities and accelerations without the use of moving parts. Thus motions of the reflective surface 11 that have both high frequencies and large amplitudes can be produced.

Formula herein follow the notational conventions of Mandel and Wolf in Optical Coherence and Quantum Optics, Cambridge University Press. 1995. Assuming that the laminae are sufficiently closely spaced and their energizing process is long enough that the reflective surface motion can be treated as continuous. Not activated, laminae are transparent; when activated laminae are perfectly reflecting.

Using the continuous Fock space approach to quantizing the electromagnetic field from Schweber in chapter 7 of An Introduction to Relativistic Quantum Field Theory, the electric field operator in empty space and in the absence of the boundaries is given by:

$$\hat{E}(r,t) = \frac{i}{(2\pi)^2} \sum_{s=1}^{2} \int \sqrt{\frac{\hbar c k}{2\varepsilon_0}} [\hat{a}(k,s)\varepsilon(k,s)e^{i(k \cdot r - \omega t)} - h.c.] d^3k \qquad (1)$$

where $\varepsilon_0$ is the vacuum dielectric constant. Quantities in bold type are 3-vectors, and a carrot over the symbol indicates a quantum operator. "h.c." stands for "Hermitian conjugate". k is the continuous wave number vector and $\omega$ is the angular frequency, where
$\omega(k)=ck$, $k=\|K\|$. $\varepsilon(k,s)$, $s=1, 2$ are the polarization vectors obeying the orthonormality conditions:

$k \cdot \varepsilon(k,s)=0, (s=1,2)$ $\varepsilon^*(k,s) \cdot \varepsilon(k,s')=\delta_{ss'}, (s,s'=1,2)$ $\varepsilon(k,1) \times \varepsilon(k,2)=k/k=\kappa$ \qquad (2.a-c)

The terms $\hat{a}(k,s)$, and $\hat{a}^\dagger(k,s)$ are the annihilation and creation operators for photons of wave vector k, and polarization s. These obey the commutation relations:

$[\hat{a}(k,s),\hat{a}^\dagger(k',s')]=\delta^3(k-k')\delta_{ss'}$ $[\hat{a}(k,s),\hat{a}(k',s')]=0$ $[\hat{a}^\dagger(k,s),\hat{a}^\dagger(k',s')]=0$ \qquad (3.a-c)

Equations (1) describe the free electromagnetic field, and we assume that this is the condition of the field at the initial instant, t=0. Note that the quantized fields are coupled by the same Maxwell Equations as the classical fields from which they came, i.e.:

$$\nabla \times \hat{E}(r,t) = -\frac{\partial}{\partial t}\hat{B}(r,t), \qquad (4.a-d)$$

$$\nabla \times \hat{B}(r,t) = \frac{1}{c^2}\frac{\partial}{\partial t}\hat{E}(r,t)$$

-continued $$\nabla \cdot \hat{E}(r, t) = 0,$$

$$\nabla \cdot \hat{B}(r, t) = 0$$

Since the time dependence of all terms in (1) is $e^{-i\omega t}$, one can substitute (1) into (4.a) and integrate with respect to time to obtain:

$$\hat{B}(r, t) = \frac{i}{(2\pi)^2} \sum_{s=1}^{2} \int \sqrt{\frac{h}{2ck\varepsilon_0}} [\hat{a}(k, s)(\nabla \times \varepsilon(k, s)e^{i(k \cdot r - \omega t)}) - h.c.] d^3k \quad (5)$$

Since the only spatial dependence in the free field is $e^{ik \cdot r}$, the $\nabla \times \varepsilon(k,s)e^{i(k \cdot r - \omega t)}$ term can be replaced by $ik \times \varepsilon(k,s)e^{i(k \cdot r - \omega t)}$. Thus, in the free field, the magnetic field operator is:

$$\hat{B}(r, t) = \frac{i}{(2\pi)^2} \sum_{s=1}^{2} \int \sqrt{\frac{h}{2ck\varepsilon_0}} [\hat{a}(k, s)(k \times \varepsilon(k, s))e^{i(k \cdot r - \omega t)} - h.c.] d^3k \quad (6)$$

We view the problem in the Heisenberg picture in which the initial state is fixed and it is the operators that evolve in time. It is assumed that the field is initially (at time t=0) in the free-field state; thus (1) and (6) give the initial values of the electric and magnetic field operators. The operators then evolve according to the Heisenberg equations of motion. However, these are equivalent to the Maxwell operator equations, (4), (see [15], Art. 10.4.5).

As (1) indicates, to determine the electric field operator beyond t=0, we need only consider the time evolution of the operator $\hat{a}(k,s)\varepsilon(k,s)e^{i(k \cdot r - \omega t)}$. Hence beyond t=0, (1) becomes:

$$\hat{E}(r, t) = \quad (7)$$

$$\frac{i}{(2\pi)^2} \sum_{s=1}^{2} \int \sqrt{\frac{h}{2\varepsilon_0}} \sqrt{\tilde{\omega}(k, s, x, t)} [\Phi_{k,s}(r, t)\hat{a}(k, s) - h.c.] d^3k$$

where $\tilde{\omega}(k,s,x,t)$ is the frequency of the field $\Phi_{k,s}(r,t)$. $\Phi_{k,s}(r,t)$ is a vector-valued function satisfying the wave equation derived from (4), all boundary conditions for t>0, and the initial condition $\Phi_{k,s}(r,t=0)=\varepsilon(k,s)e^{i(k \cdot r)}$.

To characterize the evolution of the magnetic field operator, we substitute (7) into (4.a) and integrate over time to obtain:

$$\hat{B}(r, t) = -\frac{i}{(2\pi)^2} \sum_{s=1}^{2} \int \sqrt{\frac{h}{2\varepsilon_0}} \quad (8)$$

$$\sqrt{\tilde{\omega}(k, s, x, t)} \left[ \left[ \int^t \nabla \times \Phi_{k,s}(r, \tau) d\tau \right] \hat{a}(k, s) - h.c. \right] d^3k$$

The momentum of the quantized field is the object of our particular attention. This is the spatial integral of the symmetrized Poynting vector:

$$\hat{P} = \tfrac{1}{2}\varepsilon_0 \int [\hat{E}(r,t) \times \hat{B}(r,t) - \hat{B}(r,t) \times \hat{E}(r,t)] d^3r \quad (9)$$

Using (7) and (8) in (9), we get:

$$\hat{P} = \frac{h}{2(2\pi)^4} \int \left[ \sum_{s=1}^{2} \sum_{s'=1}^{2} \int d^3k \int d^3k' \sqrt{\tilde{\omega}\tilde{\omega}'} \right. \quad (10)$$

$$\left\{ \begin{array}{l} [[\Phi_{k,s}(r, t)\hat{a}(k, s) - \Phi_{k,s}^*(r, t)\hat{a}^\dagger(k, s)]] \times \\ \left[ \int^t \nabla \times \Phi_{k',s'}(r, \tau) d\tau \right] \hat{a}(k', s') - \\ \left[ \int^t \nabla \times \Phi_{k',s'}^*(r, \tau) d\tau \right] \hat{a}^\dagger(k', s') ] \end{array} \right\} d^3r \Bigg]$$

Expanding this quantity and using the commutation relations, (3), produces:

$$\hat{P} = \frac{h}{2(2\pi)^4} \quad (11)$$

$$\int \left[ \sum_{s=1}^{2} \sum_{s'=1}^{2} \int d^3k \int d^3k' \sqrt{\tilde{\omega}\tilde{\omega}'} \left\{ \begin{array}{l} \Phi_{k,s}(r, t) \times \left[ \int^t \nabla \times \Phi_{k',s'}(r, \tau) d\tau \right] \\ \hat{a}(k, s)\hat{a}(k', s') - \\ \Phi_{k,s}^*(r, t) \times \left[ \int^t \nabla \times \Phi_{k',s'}(r, \tau) d\tau \right] \\ \hat{a}^\dagger(k, s)\hat{a}(k', s') - \\ \Phi_{k,s}(r, t) \times \left[ \int^t \nabla \times \Phi_{k',s'}^*(r, \tau) d\tau \right] \\ \left( \hat{a}^\dagger(k', s')\hat{a}(k, s) + \atop \delta^3(k - k')\delta_{s,s'} \right) + \\ \Phi_{k,s}^*(r, t) \times \left[ \int^t \nabla \times \Phi_{k',s'}^*(r, \tau) d\tau \right] \\ \hat{a}^\dagger(k, s)\hat{a}^\dagger(k', s') + h.c. \end{array} \right\} \right] d^3r$$

where use has been made of the commutation relation (3.a). Noting that the initial state is assumed to be the vacuum state (zero temperature), and $\hat{a}(k)|vac\rangle = \langle vac|\hat{a}^\dagger(k) = 0$ the average momentum of the field is given by $\langle \hat{P} \rangle = \langle vac|\hat{P}|vac \rangle$. Substituting (11), we get:

$$\langle \hat{P} \rangle = -\frac{h}{4(2\pi)^4} \quad (12)$$

$$\int \left[ \sum_{s=1}^{2} \int \tilde{\omega}(k, s, r, t) \left[ \begin{array}{l} \Phi_{k,s}(r, t) \times \int^t \nabla \times \Phi_{k,s}^*(r, \tau) d\tau + \\ \Phi_{k,s}^*(r, t) \times \int^t \nabla \times \Phi_{k,s}(r, \tau) d\tau \end{array} \right] d^3k \right] d^3r$$

The boundary conditions considered here are such that no evanescent waves exist and the evolving field is a combination of plane waves. Under these conditions:

$$\tilde{\omega}(k, s, r, t)\Phi_{k,s}(r, t) \times \int^t \nabla \times \Phi_{k,s}^*(r, \tau) d\tau = \quad (13)$$

$$\frac{1}{i}\Phi_{k,s}(r, t) \times (\nabla \times \Phi_{k,s}^*(r, t))$$

Hence, (12) becomes:

$$\langle \hat{P} \rangle = \frac{i\hbar}{4(2\pi)^4} \sum_{s=1}^{2} \int \left[ \int \int [\Phi_{k,s}(r,t) \times (\nabla \times \Phi_{k,s}^*(r,t)) - \Phi_{k,s}^*(r,t) \times (\nabla \times \Phi_{k,s}(r,t))] d^3k \right] d^3r \quad (14)$$

where the $\Phi_{k,s}(r,t)$ must satisfy:

$$\nabla^2 \Phi_{k,s}(r,t) = \frac{1}{c^2} \frac{\partial^2}{\partial t^2} \Phi_{k,s}(r,t), \quad (15, \text{a-c})$$

$$\nabla \cdot \Phi_{k,s}(r,t) = 0,$$

$$\Phi_{k,s}(r, t=0) = e^{ik \cdot r} \varepsilon(k,s)$$

Regarding boundary conditions, we assume a time-varying, partially reflective surface, $\wp$, with unit normal $\hat{n}(r,t)$, $r \in \wp(t)$, and reflection coefficient $R(k)$. Let $\wp_+(t)$ and $\wp_-(t)$ denote infinitesimally thick, open neighborhoods of $\wp$ in the directions such that $\hat{n}(r \in \wp, t) \cdot k > 0$ and $\hat{n}(r \in \wp, t) \cdot k < 0$, respectively. Then we adopt the simple model:

$$\hat{n}(r \in \wp, t) \times \left[ \sqrt{1 - |R(k)|^2} \, \Phi_{k,s}^+(r \in \wp_-, t) - \Phi_{k,s}^-(r \in \wp_+, t) \right] = 0 \quad (16.\text{a,b})$$

$$\hat{n}(r \in \wp, t) \times [|R(k)| \Phi_{k,s}^+(r \in \wp_-, t) + \Phi_{k,s}^-(r \in \wp_-, t)] = 0$$

$$\hat{n}(r \in \wp, t) \times \left[ \sqrt{1 - |R(k)|^2} \, \Phi_{-k,s}^+(r \in \wp_+, t) - \Phi_{-k,s}^-(r \in \wp_-, t) \right] = 0$$

$$\hat{n}(r \in \wp, t) \times [|R(k)| \Phi_{-k,s}^+(r \in \wp_+, t) + \Phi_{-k,s}^-(r \in \wp_+, t)] = 0$$

where the + or − superscript denotes the components approaching or receding from the boundary, respectively.

A model of $R(k)$ should capture the fact that any conductive material is transparent to radiation that has frequencies above the plasma frequency, $\omega_p$. Following the Drude-Sommerfeld model [17-19], the upper limit of the wavenumber might be some fraction of:

$$\bar{k} = \omega_p / c \quad (17.\text{a,b})$$

$$\omega_p = \sqrt{\frac{4\pi n_e e^2}{m^*}} \left( = 8980 \sqrt{n_e} \text{ Hz} \right)$$

where $m^*$ is the effective mass of the charge carriers, e is the elementary charge, and $n_e$ is the volumetric number density of the charge carriers. $\omega_p$ may be typically $\approx 10^{14}$ Hz, and the value for metals can be a hundred or even a thousand-fold larger. In what follows, we adopt the simple model:

$$R(k) = \exp(-k/\zeta \bar{k}) \quad (18)$$

where $\zeta \leq 1$ is a discount factor. formula (18) is essentially a formal regularization since we ignore the details of the dielectric function of the materials: the effects of absorption, and the semiconductor design and parameters.

Figure 2:
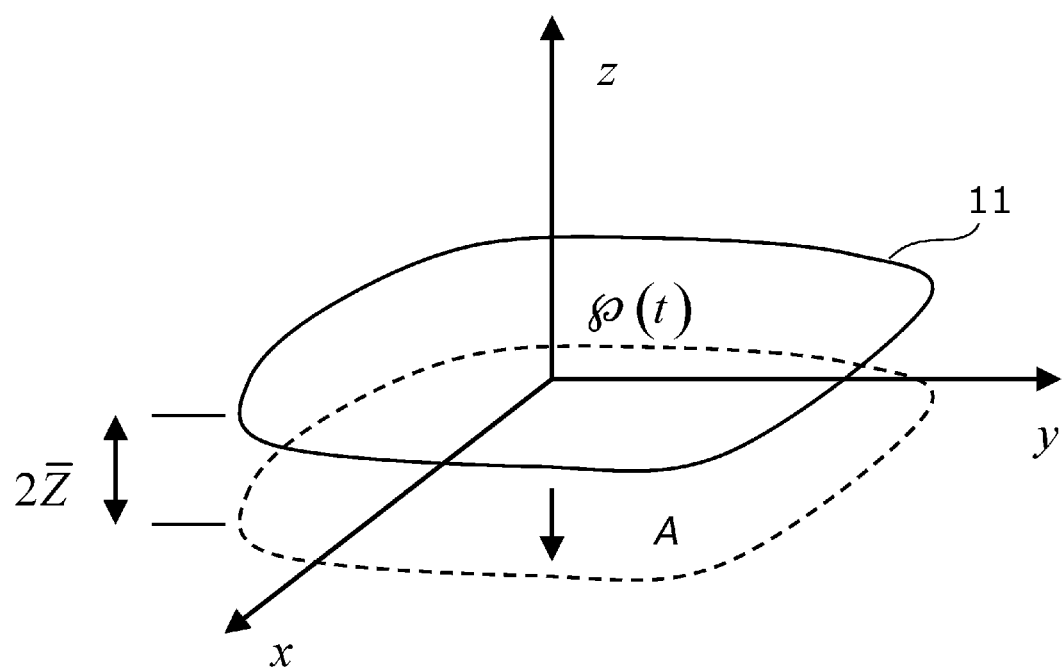
FIG. 2 shows a surface that is a section of a plane parallel to the x-y axis wherein the electric field propagation direction is mainly along the z-axis.

Define a coordinate system, (x,y,z), with unit orthogonal basis vectors $(\hat{x}, \hat{y}, \hat{z})$. Consider the case in which surface $\wp(t)$ is a section of a plane having area A and parallel to the x-y axis, as illustrated in FIG. 2. Its motion is along the z axis with z-coordinate q(t), where $q(t) \in [-\bar{Z}, +\bar{Z}]$. Assuming $\bar{Z} \ll \sqrt{A}$, the electric field propagation direction is mainly along the z-axis, so that $k = \pm k\hat{z}$. Also, assume the two polarization vectors are $\hat{x}$, and $\hat{y}$.

Omitting from (14) the integrations over the x and y components of the position vector and the wave number vector. The dynamics of the electric fields in either polarization are identical, so that (14) and (15) specialize to:

$$\langle \hat{P} \rangle = \hat{z} \frac{i\hbar}{(2\pi)^4} \int_0^\infty dk \left[ \sum_{\alpha=-1}^{+1} \int_{-\infty}^{\infty} \left[ \begin{array}{c} \Phi_{\alpha k}(z,t) \frac{\partial}{\partial z} \Phi_{\alpha k}^*(z,\tau) - \\ \Phi_{\alpha k}^*(z,\tau) \frac{\partial}{\partial z} \Phi_{\alpha k}(z,t) \end{array} \right] dz \right] \quad (19.\text{a-c})$$

$$\frac{\partial^2}{\partial z^2} \Phi_{\alpha k}(z,t) = \frac{1}{c^2} \frac{\partial^2}{\partial t^2} \Phi_{\alpha k}(z,t)$$

$$\Phi_{\alpha z}(z, t \leq 0) = \exp\{ik(\alpha z - ct)\}, \alpha = -1, +1$$

The boundary conditions, (16), are:

$$\sqrt{1 - |R(k)|^2} \Phi_k^+(z=q^{(-)}(t),t) = \Phi_k^-(z=q^{(+)}(t),t)$$

$$|R(k)| \Phi_k^+(z=q^{(-)}(t),t) + \Phi_k^-(z=q^{(-)}(t),t) = 0$$

$$\sqrt{1 - |R(k)|^2} \Phi_{-k}^+(z=q^{(+)}(t),t) = \Phi_{-k}^-(z=q^{(+)}(t),t)$$

$$|R(k)| \Phi_{-k}^+(z=q^{(+)}(t),t) + \Phi_{-k}^-(z=q^{(+)}(t),t) = 0 \quad (20.\text{a-c})$$

First Example

Suppose that the surface $\wp = (x,y)$ is created (turned on) at location $z=\bar{Z}$ at time t, then travels in the negative z direction at speed V, until it reaches $\bar{Z}=-\bar{Z}$ at which point it is annihilated (turned off). That is:

$$q(t) = \bar{Z} - Vt, t \in [0, 2\bar{Z}/V] \quad (21)$$

Obviously, for $|z-\bar{Z}| \notin [0, Vt]$, the field is undisturbed and thus, by (19.c), must have the form:

$$\Phi_{\alpha k}(z,t) = \exp(ik(\alpha z - ct)), \alpha = -1, +1 \quad (22)$$

Substitution into (19.a) shows that this region contributes nothing to the average momentum.

Consider now the solution to the wave equation for $\Phi_{+1,k}(z,t)$. This quantity is the evolution of the field when it is initially in the single mode $\Phi_{+1,k}(z,t=0) = \exp(ikz)$. It therefore has both rightward and leftward traveling waves. Since there is a discontinuity at $z < \bar{Z} - Vt$, $\Phi_{+1,k}(z,t)$ has the form:

$$\Phi_{+1,k}(z,t) = \begin{cases} \exp(ik(z-ct)) + a\exp(-ik_+(z+ct)), & z \geq \bar{Z} - Vt \\ b\exp(ik(z-ct)), & z > \bar{Z} - Vt \end{cases} \quad (23)$$

Then, the discontinuity conditions, (20) show that:

$$k_+ = \frac{c+V}{c-V} k, \quad a = -R(k), \quad b = \sqrt{1 - |R(k)|^2} \quad (24.\text{a-c})$$

In summary, $\Phi_{+1,k}(z,t)$ is given by:

$$\Phi_{+1,k}(z,t) = \begin{cases} \exp(ik(z-ct)), \, z < \overline{Z} - ct \\ \exp(ik(z-ct)) - R(k)\exp(-ik_+(z+ct)), \\ \quad \overline{Z} - ct \leq z \leq \overline{Z} - Vt \\ \sqrt{1-|R(k)|^2}\exp(ik(z-ct)), \overline{Z} + ct > z > \overline{Z} - Vt \\ \exp(ik(z-ct)), \, z \geq \overline{Z} + ct \end{cases} \quad (25.\text{a},\text{b})$$

$$k_+ = \frac{c+V}{c-V}k$$

In similar manner, $\Phi_{-1,k}(z,t)$ is found to be:

$$\Phi_{-k}(z,t) = \begin{cases} \exp(-ik(z+ct)), \, z < \overline{Z} - ct \\ \exp(-ik(z+ct)) - R(k)\exp(-ik_-(z-ct)), \\ \quad \overline{Z} + ct \geq z \geq \overline{Z} - Vt \\ \sqrt{1-|R(k)|^2}\exp(-ik(z+ct)), \overline{Z} - ct < z < \overline{Z} - Vt \\ \exp(-ik(z+ct)), \, z \geq \overline{Z} + ct \end{cases} \quad (26.\text{a},\text{b})$$

$$k_- = \frac{c-V}{c+V}k$$

Note that the portions of $\Phi_{+1,k}(z,t)$ and $\Phi_{-1,k}(z,t)$ located in $|z-\overline{Z}|>ct$ make contributions to the z-integral of (19.a) of equal and opposite sign, and therefore can be ignored. Then the term in braces in (19.a) becomes:

$$\sum_{a=-1}^{+1}\int_{-\infty}^{\infty}\left\{\Phi_{ak}(z,t)\frac{\partial}{\partial z}\Phi^*_{ak}(z,t) - \Phi^*_{ak}(z,t)\frac{\partial}{\partial z}\Phi_{ak}(z,t)\right\}dz = \quad (27)$$

$$i8k|R(k)|^2 Vt + i4\beta R_I\left\{\cos\left(\frac{2k}{1-\beta}\overline{Z}\right) - \cos\left(\frac{2k}{1-\beta}\overline{Z} - 2kct\right)\right\}$$

where $\beta$ denotes the ratio V/c. Then (19.a) becomes:

$$\langle \hat{P} \rangle = -\hat{z}\frac{h}{2(\pi)^4} \quad (28)$$

$$\int_0^\infty dk\left[k|R(k)|^2 Vt + \frac{1}{2}\beta R_I\left\{\cos\left(\frac{2k}{1-\beta}\overline{Z}\right) - \cos\left(\frac{2k}{1-\beta}\overline{Z} - 2kct\right)\right\}\right]$$

Note that the second term in the integrand of (28) arises from cross products of waves traveling in opposite directions. Its magnitude compared with the first term is of order $\beta\lambda/\overline{Z}$. For motions of the conductive surface that are much larger than any effective wavelength, this term will be neglected.

If we employ the model (18) and perform the integrations:

$$\langle \hat{P} \rangle = -\frac{1}{2}\hat{z}\frac{h}{(2\pi)^4}(\varsigma\overline{k})^2 Vt \quad (29)$$

Once the surface $\wp = (x,y)$ is turned off at location $z=-\overline{Z}$, the boundary conditions no longer disturb the field and no further change in the field momentum occurs.

Figure 3:
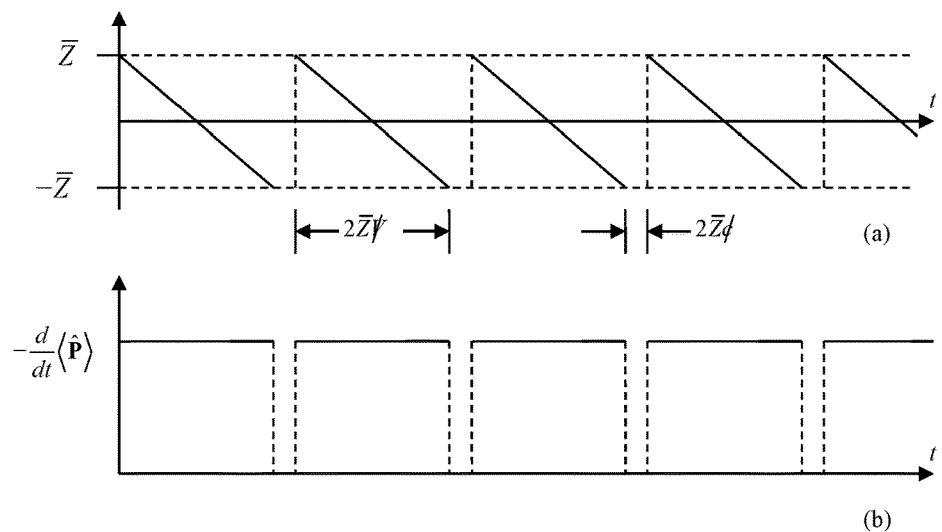
FIG. 3a shows the cyclic surface position waveform.
FIG. 3b shows that by momentum conservation, the force on the FIG. 4 shows force per unit area as a function of plasma frequency.

One could create a periodic disturbance by repeating the surface displacement waveform, (21). However if this is done immediately at $t=2\overline{Z}/V$, there will be interaction between the newly created waves and the reverberant wave still crossing the segment $z \in [-\overline{Z},+\overline{Z}]$. Such interaction ceases if one waits for time $2\overline{Z}/c$ to begin the new cycle. The momentum increment will then be the same for each cycle. FIG. 3a shows the cyclic surface position waveform so produced. By momentum conservation, the force on the mirror device is the negative derivative of the momentum change (34). This is illustrated in FIG. 3b. Note the positive direction of the force.

First Example Above Generalized to Three Dimensions

Suppose that the surface $\wp$ (x,y), and its motion are as defined in the first example above, but that we now consider the fully three dimensional case and evaluate the field momentum produced by the moving mirror directly from (14) to (16). Assuming that edge effects are negligible the integrations along the x, and y axes produce the factor A. In the wavenumber space, we adopt spherical coordinates $(k,\theta,\varphi)$, where $\theta$ is the co-elevation, and $\varphi$ is the azimuth. Then (14) becomes:

$$\langle \hat{P} \rangle = \frac{ihA}{2(2\pi)^3} \quad (30)$$

$$\sum_{s=1}^{2}\int dz \int_0^\pi \sin\theta d\theta \int_0^\infty dk k^2 [\Phi_{k,s}(r,t) \times (\nabla \times \Phi^*_{k,s}(r,t)) - \Phi^*_{k,s}(r,t) \times (\nabla \times \Phi_{k,s}(r,t))]$$

where the integration over $\varphi$ has been performed.

Now, the electric fields, $\Phi_{k,s}(r,t)$, are plane waves. Let $\tilde{k}(k,r,t)$ denote the wave vector of the wave that was initially $e^{ik\cdot r}$, evaluated at space-time point (r,t). Then:

$$\Phi_{k,s}(r,t) \times (\nabla \times \Phi^*_{k,s}(r,t)) = -i\Phi_{k,s}(r,t) \times (\tilde{k}(k,r,t) \times \Phi^*_{k,s}(r,t)) \quad (31)$$

$$= -i\tilde{k}(k,r,t)\|\Phi_{k,s}(r,t)\|^2$$

Making substitutions into (30), and averaging over the polarization state gives.

$$\langle \hat{P} \rangle = z\frac{2hA}{(2\pi)^3}\int dz \int_0^\pi \sin\theta d\theta \int dk k^2 \tilde{k}(k,r,t)\|\Phi_k(r,t)\|^2 \quad (32)$$

where $\Phi_k(r,t)$ is the scalar phase factor of the associated plane wave.

To determine the evolution of the fields corresponding to each single free-field mode. Let $\hat{\chi}$ be a unit vector normal to the z axis along any particular azimuth direction and let $\chi$ be the corresponding coordinate. Consider first the free field mode whose wave vector is. $k=-\sin\theta\hat{\chi}+\cos\theta\hat{z},(\cos\theta \geq 0)$ This is the free field plane wave heading in the positive z direction. The portion of the field incident upon the mirror and reflected from it can be expressed as:

$$\{\Phi_k(r,t)\} = |R(k)|\begin{bmatrix} \exp(ik(-\sin\theta\chi + \cos\theta(z-\overline{Z}) - ct)) + \\ r\exp(-i(-k_\chi^{(R+)}\chi + k_z^{(R+)}(z-\overline{Z}) + k^{(R+)}ct)) \end{bmatrix} \quad (33)$$

Here $k_\chi^{(R+)}$, and $k_z^{(R+)}$ are the wave vector components of the reflected wave due to the rightward going plane wave. At $z-\bar{Z}=-Vt$ the above expression in brackets must be zero, thus:

$$\exp(ik(-\sin\theta\chi-(V\cos\theta+c)t))=-r\exp(-i(-k_x^{(R+)}\chi+(-k_z^{(R+)}V+k^{(R\cdot)}c)t)) \quad (34)$$

From this it follows that:

$$r=-1$$

$$k_\chi^{(R+)}=-k\sin\theta$$

$$k(V\cos\theta+c)=(-k_z^{(R+)}V+k^{(R+)}c) \quad (35.\text{a-c})$$

Substituting $k_\chi^{(R+)}$ from (35.b) into (34), and solving for $k_z^{(R+)}$, we find that the reflected wave has the wave vector:

$$k^{(R+)}=-k^{(R+)}(\sin\theta^{(R+)}\hat{\chi}+\cos\theta^{(R+)}\hat{z}) \quad (36.\text{a-c})$$

$$k^{(R+)}=k\frac{1+2\beta\cos\theta+\beta^2}{1-\beta^2}$$

$$\cos\theta^{(R+)}=\frac{2\beta+(1+\beta^2)\cos\theta}{1+2\beta\cos\theta+\beta^2}$$

Furthermore, the transmitted wave is simply $\sqrt{1-|R(k)|^2}e^{ik(-\sin\theta\chi+\cos\theta(z-\bar{Z})-ct)}$ with wave vector $k=-\sin\theta\hat{\chi}+\cos\theta\hat{z}$. Results pertaining to the free field wave vector $k=-\sin\theta\hat{\chi}-\cos\theta\hat{z}$, ($\cos\theta>0$) can be obtained in the same manner.

It is noteworthy that in writing the field as a set of traveling waves, as in (33), we implicitly assume the constancy of the speed of light. Hence, when boundary conditions (34) are imposed we arrive at relativisticly correct results [20]. This might be considered an algebraic version of the simple geometric argument in [21].

As in the discussion under (28), each wave that evolves from an initial plane wave with a specific wave number consists, after the passage of time, of component waves traveling in different directions. As in the one-dimensional case, the cross products that occur among these components contribute terms of order $\beta\lambda/\bar{Z}$ in comparison with the dominant terms and can be neglected. We denote the components of $\Phi_k(r,t)$ traveling in the positive and negative z direction by $\Phi_k^{(+)}(z,t)$ and $\Phi_k^{(-)}(z,t)$, respectively.

Now, we can write the wave vector-scalar field products (ignoring cross-products) resulting from the free field plane waves traveling in the positive z direction as follows:

$$+k(\theta)g\hat{z}|\Phi_k^{(+)}(z,t)|^2 = \quad (37.\text{a-c})$$
$$\begin{cases} k\cos(\theta), & -ct\cos\theta \le z-\bar{Z} \le -Vt \\ k\cos(\theta)(1-|R(k)|^2), & ct\cos\theta > z-\bar{Z} > -Vt \end{cases}$$

$$k^{(R+)}(\theta)g\hat{z}|\Phi_k^{(-)}(z,t)|^2 = -k^{(R+)}|R(k)|^2\cos(\theta^{(R+)}),$$
$$-ct\cos\theta^{(R+)} \le z-\bar{Z} < -Vt$$

$$k^{(R-)}(\theta)g\hat{z}|\Phi_{-k}^{(+)}(z,t)|^2 = +k^{(R-)}|R(k)|^2\cos(\theta^{(R-)}),$$
$$+ct\cos\theta^{(R-)} \ge z-\bar{Z} \ge -Vt$$

$$-k(\theta)g\hat{z}|\Phi_{-k}^{(-)}(z,t)|^2 =$$
$$\begin{cases} -k\cos(\theta), & +ct\cos\theta \ge z-\bar{Z} \ge -Vt \\ -k\cos(\theta)(1-|R(k)|^2), & -ct\cos\theta \le z-\bar{Z} < -Vt \end{cases}$$

where:

$$k^{(R-)}=k\frac{1-2\beta\cos\theta+\beta^2}{1-\beta^2} \quad (38.\text{a, b})$$

$$\cos\theta^{(R-)}=\frac{-2\beta+(1+\beta^2)\cos\theta}{1-2\beta\cos\theta+\beta^2}$$

Using (37), the integral over z in (32) is:

$$\int \tilde{k}(k,r,t)\|\{\Phi_k(r,t)\}\|^2 dz = -2k\cos(\theta)|R(k)|^2 Vt + ct|R(k)|^2 \quad (39)$$

$$[-k^{(R+)}\cos(\theta^{(R+)})(\cos\theta^{(R+)}-\beta)+k^{(R-)}\cos(\theta^{(R-)})(\cos\theta^{(R-)}+\beta)]$$

$$= -2k\cos(\theta)|R(k)|^2 Vt + \frac{ctk}{1-\beta^2}|R(k)|^2\left[2(1+\beta^2)\cos\theta\beta\right.$$

$$\left(\frac{-(2\beta+(1+\beta^2)\cos\theta)^2(1-2\beta\cos\theta+\beta^2)}{(1+\beta^2)^2-4\beta^2\cos^2\theta}\right)+$$

$$\left.\left(\frac{(-2\beta+(1+\beta^2)\cos\theta)^2(1+2\beta\cos\theta+\beta^2)}{(1+\beta^2)^2-4\beta^2\cos^2\theta}\right)\right]=$$

$$-4k\cos\theta|R(k)|^2\left[1+\frac{1}{1-\beta^2}\left(\frac{(1+\beta^2)^2(1-\cos\theta)}{(1+\beta^2)^2-4\beta^2\cos^2\theta}\right)\right]Vt$$

Substituting into (32) gives:

$$\langle\hat{P}\rangle= \quad (40)$$

$$-\hat{z}\frac{2hA}{(\pi)^3}Vt\left(\int_0^{\pi/2}\sin\theta\cos\theta d\theta\left[1+\frac{1}{1-\beta^2}\left(\frac{(1+\beta^2)^2(1-\cos\theta)}{(1+\beta^2)^2-4\beta^2\cos^2\theta}\right)\right]\right)$$

$$\int dk k^3|R(k)|^2 = -\hat{z}\frac{2hA}{(\pi)^3}$$

$$Vt\left(\int_0^1 du\left[1+\frac{(1+\beta^2)^2}{1-\beta^2}\left(\frac{(1-u)}{(1+\beta^2)^2-4\beta^2 u^2}\right)\right]\right)\int dk k^3|R(k)|^2$$

The integral over u can be evaluated as:

$$\int_0^1 du\left[1+\frac{(1+\beta^2)^2}{1-\beta^2}\left(\frac{(1-u)}{(1+\beta^2)^2-4\beta^2 u^2}\right)\right]= \quad (41)$$

$$\ln\left\{\left(\frac{1+\beta}{1-\beta}\right)^{1/2\beta(1+\beta^2)}\left(\frac{1+\beta^2}{1-\beta^2}\right)^{1/4\beta^2}\right\}$$

And the integral over k is:

$$\int_0^\infty dk k^3|R(k)|^2 = \tfrac{3}{8}(\varsigma\bar{k})^4 \quad (42)$$

Substituting these results into (40), we have, in summary:

$$\langle\hat{P}\rangle=-\hat{z}\frac{6hA(\varsigma\bar{k})^4}{(2\pi)^3}Vt\left(\ln\left\{\left(\frac{1+\beta}{1-\beta}\right)^{1/2\beta(1+\beta^2)}\left(\frac{1+\beta^2}{1-\beta^2}\right)^{1/4\beta^2}\right\}\right) \quad (43)$$

As in the one dimensional case, we can construct a periodic waveform as in FIG. 3a can be constructed such that the field accumulates the same increment of momentum during each cycle. Since the full range of wave vectors are included, the "oil" intervals in each cycle must be somewhat longer than $2\bar{Z}/c$, however the position wave form and the force time history is still similar to those shown in FIGS. 3a and 3b. Assuming V<<c, the period of the cyclic motion is approximately 2Z/V, and it follows from (43) that the time averaged force per unit area on the momentum exchange device is:

$$\langle F \rangle = \hat{z}\frac{3}{2\pi^3}\left(\ln\left\{\left(\frac{1+\beta}{1-\beta}\right)^{1/2\beta(1+\beta^2)}\left(\frac{1+\beta^2}{1-\beta^2}\right)^{1/4\beta^2}\right\}\right)h(\varsigma\bar{k})^4\overline{Z}v_o(N/m^2) \quad (44)$$

where $v_o=V/2\overline{Z}$ is the fundamental frequency of the motion. This is very similar to what would be produced in the one-dimensional case, except for the additional factor of $(\varsigma\bar{k})^2$.

Figure 4:
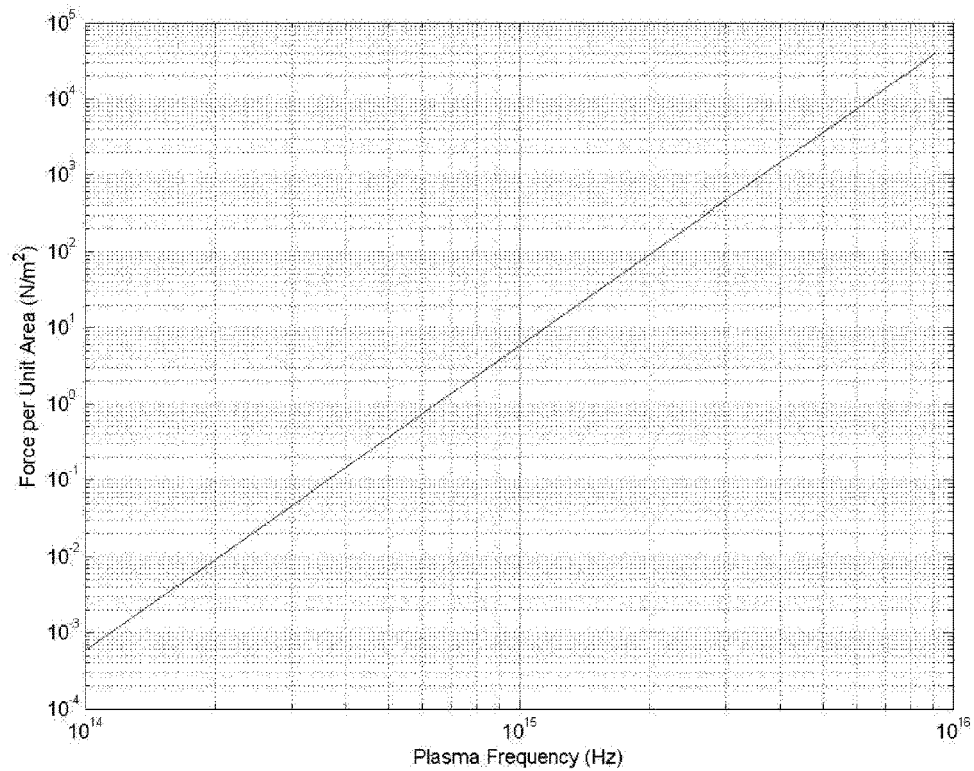

To appreciate the magnitude of the force per unit area, let us, somewhat arbitrarily, assign plausible values to the various parameters, with $\varsigma$ set to unity. Suppose the plasma frequency is in the range $10^{14}$ Hz to $10^{16}$ Hz, and that the total range of motion is one meter, so that $\overline{Z}$=0.5 m (instead of one nanometer). Also the fundamental frequency is limited by the relaxation time of the conduction band charge carriers, so let us choose the moderate rate of just 10 MHz. With these values, $\beta$ is small and the integral given by (41) is 3/2. Then the force per unit area is shown in FIG. 4. This illustrates the considerable sensitivity to the plasma frequency and, hence, to the volumetric charge carrier density. However in the mid-to-upper range of frequencies, the force magnitude is quite significant, and consistent with [8] if scaled up so that the range of motion is a meter rather than a nanometer.

The dynamic Casimir effect as a possible mechanism for propulsion. Previous investigations assumed mechanical motion of a mirror to generate thrust. In this case, because of the finite strength of materials and the high frequencies necessary, the amplitudes of motion must be restricted to the nanometer range. Here, we propose an epitaxial stack of transparent semiconductor laminae, where voltage is rapidly switched to successive laminae, thereby creating continuous motion of a front of charge carrier density. The result is the creation of a reflective surface in rapid, large amplitude motion without the use of mechanical contrivances. Since previous analysis of the propulsive effect was restricted to motions much smaller than the wavelengths of importance, we are compelled to derive correct relativistic expressions appropriate for large amplitude motion. This was accomplished for only a single, but apparently effective, motion time history at zero temperature. However, for motions of the reflective surface that are much larger than the wavelength range of significance, the approach taken here yields an eikonal approximation that may simplify calculations in more complicated cases. Another restriction is that detailed dielectric function models were not used; rather the reflectivity was based on a simple Drude-Sommerfeld model. Moreover, as for previous workers, the treatment is semi-quantum in that the epitaxial stack is modeled as a set of prescribed boundary conditions on the field operators.

Despite these restrictions, if reasonable charge carrier volumetric densities are assumed, the propulsive forces may be quite significant. The assumption of finite temperature and surface velocities that are a significant fraction of the light speed will only increase the magnitude of our estimates.

The finite response time of a semiconductor lamina allows us to create a continuously moving "front" at which the cumulative areal density of charge carriers suffices to produce a desired level of reflectance. Thus, although the laminas are discrete, their sequential stimulus at the proper rate yields the effect of a continuously moving mirror.

As an illustration, suppose that the charge carrier density, $\rho_e(t)$, in response to a voltage pulse has a simple linear rise and fall, as in:

$$h_e(t) = \rho_{max}\begin{cases} t/\tau_R, & t \le \tau_R \\ 2 - t/\tau_R, & 2\tau_R \ge t \ge \tau_R \\ 0, & t > 2\tau_R \end{cases} \quad (A-1)$$

where $\tau_R$ is the finite rise time and h(t) is the impulse response of the lamina's carrier density, $\rho_e$. Suppose each successive lamina is stimulated at a sub-multiple of the rise time. FIG. 5 illustrates the resulting motion of the carrier density profile. An incoming plane wave suffers a cumulative reflection in proportion to the total carrier population per unit area along its path. In the example of the figure, the total areal population corresponding to some reflection coefficient, |R(k)|, is suggested by the gray shaded areas.

In general, the position of the "front" along which the total reflectance reaches some value is seen to move continuously in the direction of, and with the approximate speed of, the carrier density profile. This is illustrated by the blue-shaded boundary in the FIG. 5. Besides the smooth progression, there may be higher frequency components, but these could be minimized by designing a suitable charge carrier gradient for each lamina.

To assess the achievable front speeds, consider the example of Figure A-1 where the time between inputs to successive laminas is a third of the rise time. Then the average speed of the reflective surface is $\sim 3\delta/\tau_R$ where $\delta$ is the lamina thickness. Taking a typical rise time of $10^{-9}$ s and a lamina thickness of a millimeter, we get a reflective surface speed of $\sim 3\times 10^{-3}$ m/s, i.e., $\beta \approx 0.1$. This could be significantly improved by advanced high-speed switching technology.

Here we evaluate the integral appearing in (27). First we substitute expressions (25) and (26):

$$\sum_{\alpha=-1}^{+1}\int_{-\infty}^{\infty}\left\{\Phi_{\alpha k}(z,t)\frac{\partial}{\partial z}\Phi_{\alpha k}^*(z,t)\right\}dz = \quad (B-1.a, b)$$

$$\int_{Z-ct}^{Z-Vt}[\exp(ik(z-ct)) - R(k)\exp(-ik_+(z+ct))]$$

$$\frac{\partial}{\partial z}[\exp(-ik(z-ct)) - R^*(k)\exp(ik_+(z+ct))]dz +$$

$$\int_{Z-Vt}^{Z+ct}\left[\sqrt{1-|R(k)|^2}\exp(ik(z-ct))\right]$$

$$\frac{\partial}{\partial z}\left[\sqrt{1-|R(k)|^2}\exp(-ik(z-ct))\right]dz +$$

$$\int_{Z-Vt}^{Z+ct}[\exp(-ik(z+ct)) - R(k)\exp(ik(z-ct))]$$

$$\frac{\partial}{\partial z}[\exp(ik(z+ct)) - R^*(k)\exp(-ik_-(z-ct))]dz +$$

$$\int_{Z-ct}^{Z-Vt}\left[\sqrt{1-|R(k)|^2}\exp(-ik(z+ct))\right]$$

$$\frac{\partial}{\partial z}\left[\sqrt{1-|R(k)|^2}\exp(ik(z+ct))\right]dz =$$

$$\int_{Z-ct}^{Z-Vt}[\exp(ik(z-ct)) - R(k)\exp(-ik_+(z+ct))]$$

-continued
$$[-ik\exp(-ik(z-ct)) - ik_+ R^*(k)\exp(ik_+(z+ct))]dz +$$
$$\int_{Z-Vt}^{Z+ct} [\exp(-ik(z+ct)) - R(k)\exp(ik_+(z-ct))]$$
$$[ik\exp(ik(z+ct)) + ik_+ R^*(k)\exp(-ik_+(z-ct))]$$
$$dz + ik(1-|R(k)|^2)\int_{Z-ct}^{Z-Vt} dz -$$
$$ik(1-|R(k)|^2)\int_{Z-Vt}^{Z+ct} dz$$

In the second equality above, the derivatives with respect to z are evaluated. Next the various products are expanded out:

$$\sum_{\alpha=1}^{+1}\int_{-\infty}^{\infty}\left\{\Phi_{\alpha k}(z,t)\frac{\partial}{\partial z}\Phi_{\alpha k}^*(z,t)\right\}dz = \quad (B-2)$$

$$\int_{Z-ct}^{Z-Vt}[-ik_+ R^*(k)\exp(ik_+(z,ct))\exp(ik(z-ct))]dz +$$
$$\int_{Z-ct}^{Z-Vt}[ikR(k)\exp(-ik(z-ct))\exp(-ik_+(z+ct))]dz +$$
$$\int_{Z-Vt}^{Z+ct}[ik_+ R^*(k)\exp(-ik_-(z-ct))\exp(-ik(z+ct))]dz +$$
$$\int_{Z-Vt}^{Z+ct}[-ikR(k)\exp(ik(z+ct))\exp(ik_-(z-ct))]dz +$$
$$ik(1-|R(k)|^2)\int_{Z-ct}^{Z-Vt} dz -$$
$$ik(1-|R(k)|^2)\int_{Z-Vt}^{Z+ct} dz + ik_+|R(k)|^2\int_{Z-ct}^{Z-Vt} dz -$$
$$ik_-|R(k)|^2\int_{Z-Vt}^{Z+ct} dz - ik\int_{Z-ct}^{Z-Vt} dz + ik\int_{Z-Vt}^{Z+ct} dz$$

Performing the integrations, we obtain:

$$\sum_{\alpha=-1}^{+1}\int_{-\infty}^{\infty}\left\{\Phi_{\alpha k}(z,t)\frac{\partial}{\partial z}\Phi_{\alpha k}^*(z,t)\right\}dz = \quad (B-3)$$

$$\left[-k_+ R^*(k)\frac{1}{k_+ + k}\exp(ik_+(z+ct) + ik(z-ct))\right]_{Z-ct}^{Z-Vt} +$$
$$\left[-kR(k)\frac{1}{k_+ + k}\exp(-ik(z-ct) - ik_+(z+ct))\right]_{Z-ct}^{ZZ-Vt} +$$
$$\left[-k_- R^*(k)\frac{1}{k_- + k}\exp(ik_-(z-ct) - ik(z+ct))\right]_{Z-Vt}^{Z+ct} +$$
$$\left[-kR(k)\frac{1}{k_- + k}\exp(ik(z+ct) + ik_-(z-ct))\right]_{Z-Vt}^{Z+ct} +$$
$$ik(1-|R(k)|^2)(c-V)t - ik(1-|R(k)|^2)(c+V)t +$$
$$ik_+|R(k)|^2(c-V)t - ik_-|R(k)|^2(c+V)t - ik(c-V)t + ik(c+V)t$$

Next evaluate the limits in the first four terms and add up the remaining terms:

$$\sum_{\alpha=-1}^{+1}\int_{-\infty}^{\infty}\left\{\Phi_{\alpha k}(z,t)\frac{\partial}{\partial z}\Phi_{\alpha k}^*(z,t)\right\}dz = \quad (B-4)$$

-continued
$$\left[-k_+ R^*(k)\frac{1}{k_+ + k}\exp(ik_+(\bar{Z} - Vt + ct) + ik(\bar{Z} - Vt - ct)) - \right.$$
$$kR(k)\frac{1}{k_+ + k}\exp(-ik(\bar{Z} - Vt - ct) - ik_+(\bar{Z} - Vt + ct))\Big] -$$
$$\left[-k_+ R^*(k)\frac{1}{k_+ + k}\exp(ik_+(\bar{Z} - ct + ct) + ik(\bar{Z} - ct - ct)) - \right.$$
$$kR(k)\frac{1}{k_+ + k}\exp(-ik(\bar{Z} - ct - ct) - ik_+(\bar{Z} - ct + ct))\Big] +$$
$$\left[-k_- R^*(k)\frac{1}{k_+ + k}\exp(-ik_-(\bar{Z} + ct - ct) - ik(\bar{Z} + ct + ct)) - \right.$$
$$kR(k)\frac{1}{k_- + k}\exp(ik(\bar{Z} + ct + ct) + ik_-(\bar{Z} + ct - ct))\Big] -$$
$$\left[-k_- R^*(k)\frac{1}{k_- + k}\exp(-ik_-(Z - Vt - ct) - ik(\bar{Z} - Vt + ct)) - kR(k)\frac{1}{k_- + k}\exp(ik(\bar{Z} - Vt + ct) + ik_-(\bar{Z} - Vt - ct))\right] + i4k|R(k)|^2 Vt$$

Now substitute $k_+ = (c+V)/(c-V)$, and $k_- = (c-V)/(c+V)$ to obtain:

$$\sum_{\alpha=-1}^{+1}\int_{-\infty}^{\infty}\left\{\Phi_{\alpha k}(z,t)\frac{\partial}{\partial z}\Phi_{\alpha k}^*(z,t)\right\}dz - i4k|R(k)|^2 Vt = \quad (B-5)$$

$$\left[-R^*(k)\frac{c+V}{2c}\exp\left(ik\frac{2c}{c-V}\bar{Z}\right) - R(k)\frac{c-V}{2c}\exp\left(-ik\frac{2c}{c-V}\bar{Z}\right)\right] +$$
$$\left[R^*(k)\frac{c-V}{2c}\exp\left(-ik\frac{2c}{c+V}\bar{Z}\right) + R(k)\frac{c+V}{2c}\exp\left(ik\frac{2c}{c+V}\bar{Z}\right)\right] +$$
$$\left[R^*(k)\frac{c+V}{2c}\exp\left(ik\frac{2c}{c-V}(\bar{Z}) - ik(2ct)\right) + R(k)\frac{c-V}{2c}\exp\left(-ik\frac{2c}{c-V}\bar{Z} + ik(2ct)\right)\right] +$$
$$\left[-R^*(k)\frac{c-V}{2c}\exp\left(-ik\frac{2c}{c+V}(\bar{Z}) - ik(2ct)\right) - R(k)\frac{c+V}{2c}\exp\left(+ik\frac{2c}{c+V}\bar{Z} + ik(2ct)\right)\right]$$

The full expression for $$\sum_{\alpha=-1}^{+1}\int_{-\infty}^{\infty}\left[\Phi_{\alpha k}(z,t)\frac{\partial}{\partial z}\Phi_{\alpha k}^*(z,t) - \Phi_{\alpha k}^*(z,\tau)\frac{\partial}{\partial z}\Phi_{\alpha k}(z,t)\right]dz$$

is twice the imaginary part of $$\sum_{\alpha=-1}^{+1}\int_{-\infty}^{\infty}\left[\Phi_{\alpha k}(z,t)\frac{\partial}{\partial z}\Phi_{\alpha k}^*(z,\tau)\right]dz.$$

Hence in the above expression, we cull the real part to obtain the desired result, equation (27):

$$\sum_{\alpha=-1}^{+1}\int_{-\infty}^{\infty}\left[\Phi_{\alpha k}(z,t)\frac{\partial}{\partial z}\Phi_{\alpha k}^*(z,\tau) - \Phi_{\alpha k}^*(z,\tau)\frac{\partial}{\partial z}\Phi_{\alpha k}(z,t)\right]dz = \quad (B-6)$$

-continued $$i8k|R(k)|^2 Vt + i4\beta R_t \left\{ \cos\left(\frac{2k}{1-\beta}\overline{Z}\right) - \cos\left(\frac{2k}{1-\beta}\overline{Z} - 2kct\right) \right\}$$

The invention claimed is:

1. A dynamic Casimir effect device for moving reflective surfaces rapidly comprising:
an epitaxial stack of closely spaced parallel semiconductor lamina; and a voltage source; wherein each said semiconductor lamina is connected to said voltage source such that said voltage source can apply voltage to each semiconductor lamina.

2. The device as in claim 1 wherein each said semiconductor lamina becomes a reflecting conductor when said voltage source applies said voltage to said semiconductor lamina.

3. The device as in claim 2 wherein each said semiconductor lamina is a partially transparent dielectric when no voltage is applied to said semiconductor lamina.

4. The device as in claim 3 wherein said semiconductor lamina each comprise an amorphous oxide transparent semiconductor.

5. The as in claim 3 wherein said voltage source can be switched among said semiconductor lamina.

6. The as in claim 3 wherein said voltage source applies voltage to each semiconductor lamina in succession.

7. The as in claim 6 wherein said application of voltage to each semiconductor lamina in succession produces a moving reflective surface.

8. The as in claim 1 wherein said semiconductor lamina are sufficiently closely spaced and their energizing process is long enough that the reflective surface motion can be treated as continuous.

9. The as in claim 1 wherein said semiconductor lamina are each less than one millimeter thick.

10. The as in claim 7 wherein said moving reflective surface moves at least at 5% of the speed of light.

11. The as in claim 6 wherein said voltage source can apply voltage to each semiconductor lamina in succession to create continuous motion of a front of charge carrier density.

12. The as in claim 6 wherein said voltage source can apply voltage to each semiconductor lamina in succession such that said device generates a reflective surface that moves in rapid, large amplitude motion.

* * * * *

UNITED STATES PATENT AND TRADEMARK OFFICE
CERTIFICATE OF CORRECTION

PATENT NO. : 10,393,095 B2
APPLICATION NO. : 15/555548
DATED : August 27, 2019
INVENTOR(S) : David Hyland It is certified that error appears in the above-identified patent and that said Letters Patent is hereby corrected as shown below:

In the Claims

Column 16, Line 1 for Claim '5', the claim should read:
5. The device as in claim 3 wherein said voltage source can be switched among said semiconductor lamina.

Column 16, Line 3 for Claim '6', the claim should read:
6. The device as in claim 3 wherein said voltage source applies voltage to each semiconductor lamina in succession.

Column 16, Line 5 for Claim '7', the claim should read:
7. The device as in claim 6 wherein said application of voltage to each semiconductor lamina in succession produces a moving reflective surface.

Column 16, Line 8 for Claim '8', the claim should read:
8. The device as in claim 1 wherein said semiconductor lamina are sufficiently closely spaced and their energizing process is long enough that the reflective surface motion can be treated as continuous.

Column 16, Line 12 for Claim '9', the claim should read:
9. The device as in claim 1 wherein said semiconductor lamina are each less than one millimeter thick.

Column 16, Line 14 for Claim '10', the claim should read:
10. The device as in claim 7 wherein said moving reflective surface moves at least at 5% of the speed of light.

Column 16, Line 16 for Claim '11', the claim should read:
11. The device as in claim 6 wherein said voltage source can apply voltage to each semiconductor lamina in succession to create continuous motion of a front of charge carrier density.

Column 16, Line 19 for Claim '12', the claim should read:

Signed and Sealed this
Third Day of November, 2020

Andrei Iancu
*Director of the United States Patent and Trademark Office*

12. The device as in claim 6 wherein said voltage source can apply voltage to each semiconductor lamina in succession such that said device generates a reflective surface that moves in rapid, large amplitude motion.